US012734781B2

(12) United States Patent
Liu et al.

(10) Patent No.: US 12,734,781 B2
(45) Date of Patent: Sep. 15, 2026

(54) DISPLAY PANEL AND DISPLAY DEVICE

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventors: Yanhua Liu, Shanghai (CN); Mingyan Huang, Xiamen (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 239 days.

(21) Appl. No.: 18/416,908

(22) Filed: Jan. 19, 2024

(65) Prior Publication Data

US 2024/0162250 A1 May 16, 2024

(30) Foreign Application Priority Data

Sep. 26, 2023 (CN) ......................... 202311258946.3

(51) Int. Cl.
*B32B 3/24* (2006.01)
*B32B 3/26* (2006.01)
(Continued)

(52) U.S. Cl.
CPC ................ *B32B 3/30* (2013.01); *B32B 3/266* (2013.01); *B32B 7/12* (2013.01); *B32B 5/142* (2013.01);
(Continued)

(58) Field of Classification Search
None
See application file for complete search history.

(56) References Cited

U.S. PATENT DOCUMENTS 10,516,135 B1 * 12/2019 Shim .................... G09G 3/3233
2002/0030769 A1 * 3/2002 Bae ................... G02F 1/136227 349/43
(Continued)

FOREIGN PATENT DOCUMENTS

CN 1560689 A * 1/2005
CN 1710999 A * 12/2005 ......... H10K 59/8722
(Continued)

*Primary Examiner* — Jeffrey A Vonch
(74) *Attorney, Agent, or Firm* — Kilpatrick Townsend & Stockton LLP

(57) ABSTRACT

A display panel and a display device. The display panel includes a display region and a non-display region including an encapsulation region, and an encapsulant is disposed in the encapsulation region between a dielectric layer and a cover plate opposite to each other. The dielectric layer in the encapsulation region includes N encapsulation sub-regions, in which a $1^{st}$ encapsulation sub-region is closest to the display region among the encapsulation sub-regions, and an $N^{th}$ encapsulation sub-region is farthest from the display region among the encapsulation sub-regions. A contact area
(Continued)

between at least the first encapsulation sub-region and the encapsulant is smaller than the contact area between any other encapsulation sub-region and the encapsulant.

20 Claims, 15 Drawing Sheets

(51) Int. Cl.
*B32B 3/30* (2006.01)
*B32B 5/14* (2006.01)
*B32B 7/12* (2006.01)
*G02F 1/1333* (2006.01)
*G02F 1/1339* (2006.01)
*G09F 9/30* (2006.01)
*H10K 50/842* (2023.01)
*H10K 59/80* (2023.01)

(52) U.S. Cl.
CPC ..... *B32B 2307/204* (2013.01); *B32B 2457/20* (2013.01); *G02F 1/133388* (2021.01); *G02F 1/1339* (2013.01); *G02F 2202/28* (2013.01); *G09F 9/30* (2013.01); *H10K 50/8426* (2023.02); *H10K 59/8722* (2023.02); *Y10T 428/24298* (2015.01); *Y10T 428/24331* (2015.01); *Y10T 428/24339* (2015.01); *Y10T 428/24488* (2015.01); *Y10T 428/24777* (2015.01)

(56) References Cited

U.S. PATENT DOCUMENTS

2003/0090615 A1* 5/2003 Park ..................... G02F 1/1339 349/153
2004/0150776 A1* 8/2004 Kim ..................... G02F 1/1339 349/138
2004/0246420 A1* 12/2004 Morimoto ............ G02F 1/1337 349/124
2004/0263740 A1* 12/2004 Sakakura .............. H05B 33/04 349/138
2005/0184927 A1* 8/2005 Kwak ................. H10D 86/441 345/45
2006/0057334 A1* 3/2006 Chen ................. H10K 59/8722 156/268
2006/0139505 A1* 6/2006 Yoshinaga ........... G02F 1/1345 349/43
2007/0126357 A1* 6/2007 Lee ................... H10K 59/8722 313/503
2007/0146598 A1* 6/2007 Yokokawa ........... G02F 1/1337 349/123
2007/0176548 A1* 8/2007 Kim .................... H10K 59/871 313/512
2007/0291216 A1* 12/2007 Chan .................... G02F 1/1339 349/110
2010/0079718 A1* 4/2010 Sekiya ............. G02F 1/133512 349/153
2011/0058135 A1* 3/2011 Misaki ................. G02F 1/1339 349/153
2011/0127548 A1* 6/2011 Lee ................... H10K 59/8722 257/E51.018
2011/0216282 A1* 9/2011 Nagami ............... G02F 1/1333 349/158
2012/0092599 A1* 4/2012 Lee .................... G02F 1/13394 349/123
2012/0099061 A1* 4/2012 Lee ......................... G02B 5/22 349/110
2012/0242946 A1* 9/2012 Itoh ...................... G02F 1/1339 349/190
2012/0319123 A1* 12/2012 Han .................. H10K 50/8426 257/E33.012
2012/0319574 A1* 12/2012 Kim ...................... H05B 33/04 313/512
2013/0286315 A1* 10/2013 Yanagisawa .......... G02F 1/1339 349/44
2014/0043574 A1* 2/2014 Ichimura .............. G02F 1/1339 349/138
2014/0072729 A1* 3/2014 Zheng .................. G02F 1/1333 29/592
2014/0133046 A1* 5/2014 Sung .................... G02F 1/1335 359/893
2014/0183458 A1* 7/2014 Lee ................... H10K 59/8722 438/46
2014/0320789 A1* 10/2014 Son .................. G02F 1/133345 156/60
2015/0001501 A1* 1/2015 Cho .................... H10K 59/131 257/40
2015/0060789 A1* 3/2015 Cho .................... H10K 59/131 257/40
2015/0060790 A1* 3/2015 Kim .................. H10K 59/8722 257/40
2015/0060893 A1* 3/2015 Cho ...................... G02F 1/1339 438/26
2015/0084498 A1* 3/2015 Choi ................. H10K 59/8722 313/504
2015/0102293 A1* 4/2015 Cho .................. H10K 59/8722 257/40
2015/0108433 A1* 4/2015 Lee ..................... H10K 59/131 438/667
2015/0108438 A1* 4/2015 Kim .................... H10K 59/124 257/40
2015/0125666 A1* 5/2015 Jeon .................. H10K 59/8722 428/192
2015/0179721 A1* 6/2015 Lee ................... H10K 59/1201 257/40
2015/0212353 A1* 7/2015 Fujiwara .......... G02F 1/133512 349/139
2015/0234230 A1* 8/2015 Hirata ................. G02B 5/3058 359/485.05
2015/0236297 A1* 8/2015 Hong .................. H10K 59/122 257/40
2015/0301370 A1* 10/2015 Moriwaki ............ G02F 1/1339 349/42
2015/0306841 A1* 10/2015 Wu ........................ B32B 3/266 428/192
2016/0029502 A1* 1/2016 Lee ........................ B32B 15/04 156/60
2016/0077376 A1* 3/2016 Lee .................. G02F 1/133512 349/110
2016/0111677 A1* 4/2016 Hong ................ H10K 59/8722 257/40
2016/0131929 A1* 5/2016 Lee .................. G02F 1/133345 257/72
2016/0133653 A1* 5/2016 Kim ................. G02F 1/133345 257/66
2016/0141547 A1* 5/2016 Kim ...................... H10K 59/12 438/26
2016/0161778 A1* 6/2016 Nishino ............... G02F 1/1339 349/42
2016/0164027 A1* 6/2016 Jeon .................... H10D 86/451 257/40
2016/0202514 A1* 7/2016 Li ....................... G02F 1/13394 349/153
2016/0218317 A1* 7/2016 Hong .................. H10K 59/124
2016/0285042 A1* 9/2016 Choi ................. H10K 50/8426
2016/0293883 A1* 10/2016 Hong .................. H10K 59/124
2017/0018603 A1* 1/2017 An .................... H10K 59/8722
2017/0077192 A1* 3/2017 Jang .................. H10K 50/8426
2017/0084865 A1* 3/2017 Chao ................. H10K 59/8722
2017/0294618 A1* 10/2017 Ko ...................... H10K 59/131
2018/0045995 A1* 2/2018 Fan ...................... G02F 1/0107
2018/0120604 A1* 5/2018 Seok .................... G02F 1/1345
2018/0151833 A1* 5/2018 Riegel ................. H10K 50/844
2018/0294434 A1* 10/2018 Niu ...................... G03F 7/0007
2018/0314097 A1* 11/2018 Kiyota ............... G02F 1/13394
2018/0373074 A1* 12/2018 Li ....................... G02F 1/13394
2019/0081272 A1* 3/2019 Jung ................... H10K 59/124
2019/0123296 A1* 4/2019 Dong .................... H10K 59/12
2020/0183205 A1* 6/2020 Chen .................... G02F 1/1337

(56) References Cited

U.S. PATENT DOCUMENTS

| | | | | |
|---|---|---|---|---|
| 2020/0387018 | A1* | 12/2020 | Wu | G02F 1/133514 |
| 2021/0257416 | A1* | 8/2021 | Sun | H10K 59/121 |
| 2021/0280819 | A1* | 9/2021 | Song | H10K 59/131 |
| 2022/0115452 | A1* | 4/2022 | Hou | H10K 59/121 |
| 2022/0244586 | A1* | 8/2022 | Zhao | G02F 1/1339 |
| 2023/0258985 | A1* | 8/2023 | Umeda | G02F 1/1339 349/157 |

FOREIGN PATENT DOCUMENTS

| | | | | | |
|---|---|---|---|---|---|
| CN | 201111807 | Y | * | 9/2008 | |
| CN | 101614901 | A | * | 12/2009 | G02F 1/1339 |
| CN | 101614914 | A | * | 12/2009 | G02F 1/1339 |
| CN | 202372734 | U | * | 8/2012 | |
| CN | 102662276 | A | * | 9/2012 | G02F 1/1339 |
| CN | 102854664 | A | * | 1/2013 | G02F 1/1333 |
| CN | 103323994 | A | * | 9/2013 | |
| CN | 103424936 | A | * | 12/2013 | G02F 1/1339 |
| CN | 103869549 | A | * | 6/2014 | |
| CN | 104538555 | A | | 4/2015 | |
| CN | 204241807 | U | * | 4/2015 | |
| CN | 105467685 | A | * | 4/2016 | G02F 1/1337 |
| CN | 105990531 | A | * | 10/2016 | |
| CN | 106556946 | A | * | 4/2017 | G02F 1/1339 |
| CN | 206209237 | U | * | 5/2017 | |
| CN | 106876606 | A | * | 6/2017 | H10K 50/8426 |
| CN | 207366901 | U | * | 5/2018 | |
| CN | 108831290 | A | * | 11/2018 | G09F 9/00 |
| CN | 108873494 | A | * | 11/2018 | G02F 1/1339 |
| CN | 109119449 | A | * | 1/2019 | H10K 59/00 |
| CN | 110854295 | A | | 2/2020 | |
| CN | 112652727 | A | * | 4/2021 | H10W 42/60 |
| CN | 112713254 | A | * | 4/2021 | H10D 86/0212 |
| CN | 113867025 | A | * | 12/2021 | G02F 1/1339 |
| CN | 114063351 | A | * | 2/2022 | G09F 9/33 |
| CN | 114545690 | A | * | 5/2022 | G02F 1/133512 |
| CN | 114967211 | A | * | 8/2022 | G02F 1/136209 |
| CN | 114967242 | A | * | 8/2022 | G02F 1/1333 |
| CN | 115561935 | A | * | 1/2023 | G02F 1/1339 |
| CN | 115857212 | A | * | 3/2023 | |
| CN | 115981055 | A | * | 4/2023 | |
| CN | 116047798 | A | * | 5/2023 | G02F 1/1333 |
| JP | H0933933 | A | * | 2/1997 | |
| JP | H0943616 | A | * | 2/1997 | |
| JP | H10282507 | A | * | 10/1998 | |
| JP | 2002229008 | A | * | 8/2002 | |
| JP | 2006053518 | A | * | 2/2006 | G02F 1/1339 |
| JP | 2007304452 | A | * | 11/2007 | |
| JP | 2009128473 | A | * | 6/2009 | |
| JP | 2016206258 | A | * | 12/2016 | |
| KR | 20050082260 | A | * | 8/2005 | H10K 77/10 |
| KR | 20050116278 | A | * | 12/2005 | H10K 50/82 |
| KR | 20060077466 | A | * | 7/2006 | H10K 77/10 |
| KR | 20100006462 | A | * | 1/2010 | G02F 1/133514 |
| KR | 20160010114 | A | * | 1/2016 | G02F 1/136286 |
| KR | 20180025048 | A | * | 3/2018 | G02F 1/1339 |

* cited by examiner

DISPLAY PANEL AND DISPLAY DEVICE

This application claims priority to Chinese Patent Application No. 202311258946.3, titled "DISPLAY PANEL AND DISPLAY DEVICE", filed on Sep. 26, 2023 with the China National Intellectual Property Administration, which is incorporated herein by reference in its entirety.

FIELD

The present disclosure relates to the field of display technology, and in particular to a display panel and a display device.

BACKGROUND

Continuous development of science and technology has engendered wide application of various display devices in people's daily life and work, which brings great convenience. Display panels are core components of the display devices. Strength of the display panel has always been a key parameter and a focus of attention due to direct influences on a performance and a service life of the display panel.

At present, the strength of the display panels concerns basically strength of an encapsulation region. How to improve the strength of the display panels is an urgent problem that needs to be solved.

SUMMARY

A display panel and a display device are provided according to embodiments of the present disclosure. The embodiments are as follows.

In one embodiment, a display panel is provided according to an embodiment of the present disclosure. The display panel includes a display region and a non-display region, where the non-display region includes an encapsulation region, and an encapsulant is disposed in the encapsulation region. The display panel further includes: a substrate; an array layer disposed at a side of the substrate; a dielectric layer disposed on a side of the array layer away from the substrate; and a cover plate disposed opposite to the dielectric layer, where the encapsulant is disposed between the dielectric layer and the cover plate. The dielectric layer in the encapsulation region includes N encapsulation sub-regions arranged sequentially along a first direction, where N is a positive integer greater than or equal to 2, an extending direction of each of the encapsulation sub-regions is identical to an extending direction of the encapsulation region, and the first direction pointing from the display region to the encapsulation region. A contact area between each of one or more encapsulation sub-regions, including a $1^{st}$ encapsulation sub-region, among the encapsulation sub-regions and the encapsulant is smaller than a contact area between each encapsulation sub-region among the encapsulation sub-regions other than the one or more encapsulation sub-regions and the encapsulant.

In one embodiment, a display device is provided according to an embodiment of the present disclosure. The display device includes the foregoing display panel.

Embodiments of the present disclosure have at least following beneficial effects in comparison with the conventional technology.

Herein the $1^{st}$ encapsulation sub-region is closest to the display region among the encapsulation sub-regions, and an $N^{th}$ encapsulation sub-region is farthest from the display region among the encapsulation sub-regions. Since the contact area between at least the first encapsulation sub-region and the encapsulant is smaller than the contact area between any other encapsulation sub-region and the encapsulant, a bonding force between at least the first encapsulation sub-region and the encapsulant is smaller than the bonding force between any other encapsulation sub-region and the encapsulant. Stress is transferred to the encapsulant when the display panel is subject to an external impact or a fall. In one embodiment, an encapsulation sub-region having a lower bonding force, e.g., the first encapsulation sub-region, can serve as a stress buffering region, and the stress can spread further away from the display region. Hence, the stress would not accumulate at a side of the encapsulant facing the display region, which prevents cracks generated at the side of the encapsulant facing the display region. Strength of the display panel is improved.

BRIEF DESCRIPTION OF THE DRAWINGS

In order to clarity illustration of the technical solutions according to embodiments of the present disclosure or conventional technology, hereinafter the drawings to be applied in embodiments of the present disclosure or technology are briefly described. Apparently, the drawings in the following descriptions are only some embodiments of the present disclosure, and other drawings may be obtained based on the provided drawings.

DETAILED DESCRIPTION OF EMBODIMENTS

Hereinafter technical solutions in embodiments of the present disclosure are described clearly and completely in conjunction with the drawings in embodiments of the present closure. Apparently, the described embodiments are only some rather than all of the embodiments of the present disclosure. Any other embodiments obtained based on the embodiments of the present disclosure by those skilled in the art without any creative effort fall within the scope of protection of the present disclosure.

Figure 1:
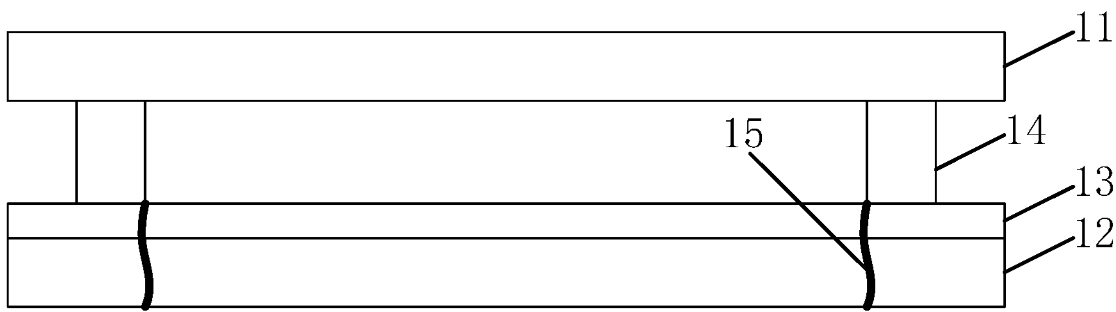
FIG. 1 is a schematic structural diagram of a cross section of a circular display panel or a rectangular display panel.
Figure 2:
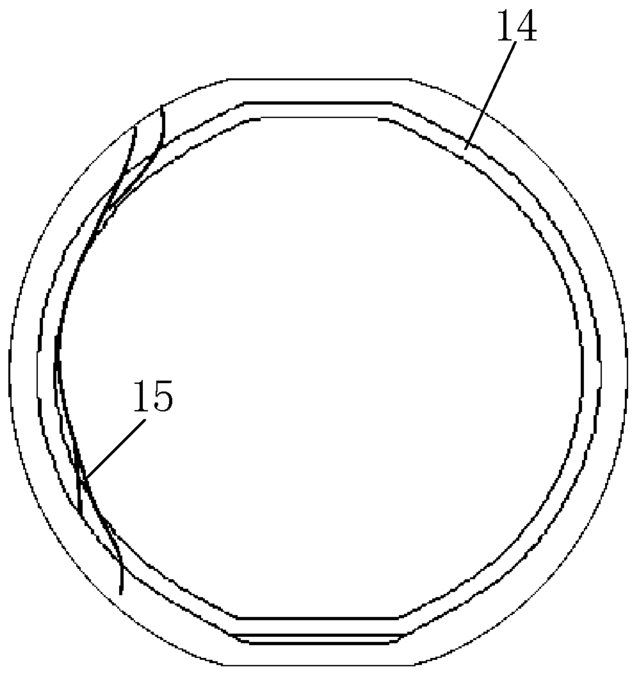
FIG. 2 is a top view of a circular display panel.

Reference is made to the foregoing background and FIG. 1, which is a schematic structural diagram of a cross section of a circular display panel or a rectangular display panel. Reference is further made to FIG. 2, which is a top view of a circular display panel, and FIG. 3, which is a top view of a rectangular display panel. The display panel includes a cover plate 11, an array layer 12 disposed opposite to the cover plate 11, a dielectric layer 13 disposed at a side of the array layer 12 facing the cover plate 11. An encapsulant 14 disposed between the cover plate 11 and the dielectric layer 13 to implement encapsulation of the display panel.

The display panel may be subject to an external impact or a fall. In one embodiment, stress generated in the circular display panel would spread as circular waves from a central region to a position of the encapsulant 14, and hence cracks appear at an inner side, i.e., a side facing a display region, of the encapsulant 14. In the rectangular display panel having an upper surface of a single-bridge structure, the stress would spread bi-directionally from a middle region as strip waves, and hence cracks also appear on the inner side of the encapsulant 14.

A display panel having a novel structure is provided according to embodiments of the present disclosure. The novel structure addresses technical problems in the conventional technology, and improves strength of the display panel greatly.

Hereinafter the present disclosure is further described in detail with reference to the drawings and some embodiments, to clarify the embodiments of the present disclosure.

Figure 4:
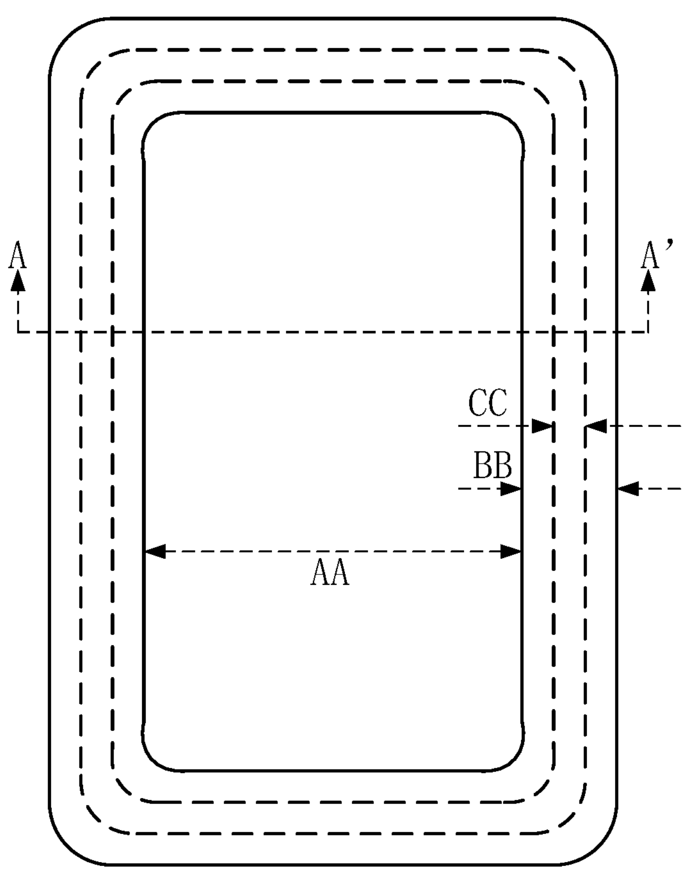
FIG. 4 is a schematic top view of a display panel according to an embodiment of the present disclosure.
Figure 5:
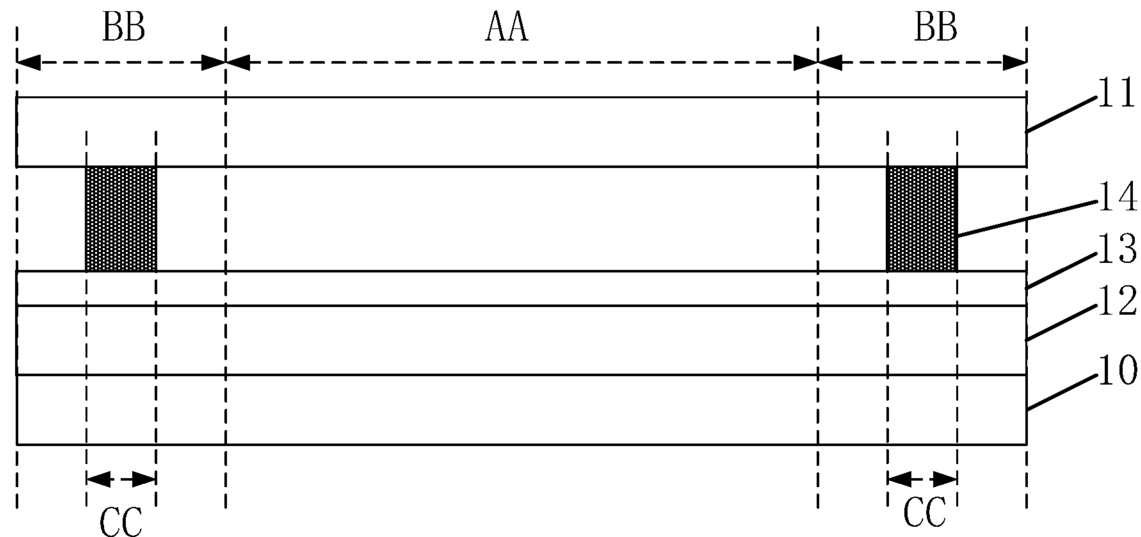
FIG. 5 is a schematic cross-sectional view of a display panel according to an embodiment of the present disclosure.

Reference is made to FIG. 4, which is a schematic top view of a display panel according to an embodiment of the present disclosure, and FIG. 5, which is a schematic cross-sectional view of a display panel according to an embodiment of the present disclosure. FIG. 5 may be regarded as a cross section along the line AA' as indicated in FIG. 4. Herein the display panel includes a display region AA and a non-display region BB, and the non-display region BB includes an encapsulation region CC. An encapsulant 14 is located in the encapsulation region CC.

The display panel further includes a substrate 10, an array layer 12 disposed on a side of the substrate 10, a dielectric layer 13 disposed on a side of the array layer 12 away from the substrate 10, and a cover plate 11 disposed opposite to the dielectric layer 13. The encapsulant 14 is located between the dielectric layer 13 and the cover plate 11. The cover plate 11 includes, but is not limited to, a glass cover plate.

Figure 6:
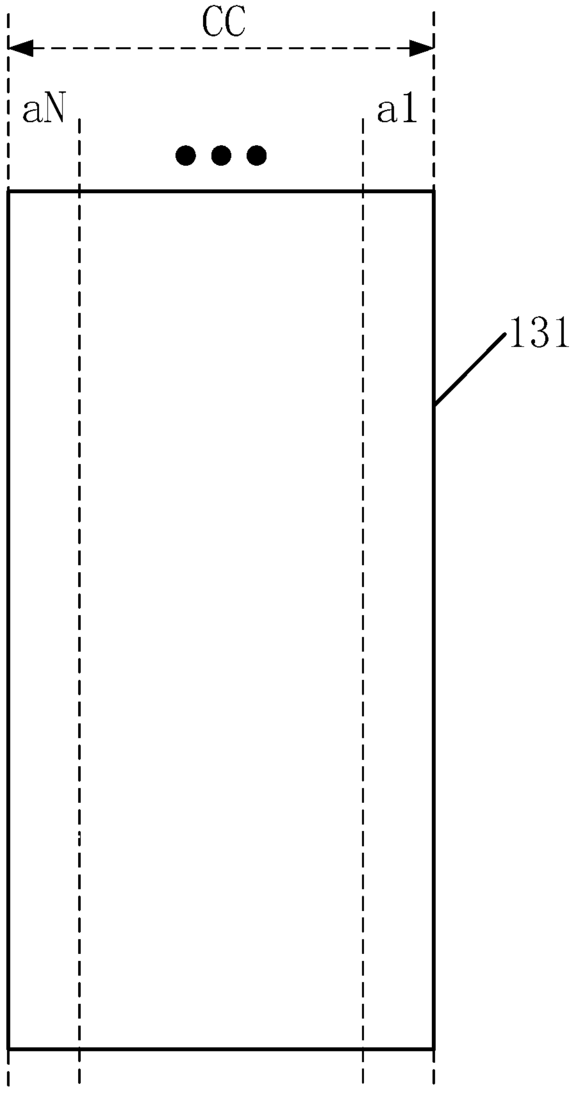
FIG. 6 is a schematic top view of a part of a dielectric layer in an encapsulation region according to an embodiment of the present disclosure.

Reference is made to FIG. 6, which a schematic top view of a part of a dielectric layer in the encapsulation region according to an embodiment of the present disclosure. The dielectric layer 13 in the encapsulation region CC has a region 131 for encapsulation. The region 131 includes N encapsulation sub-regions, a1 to aN, which are arranged along a first direction in the above-listed sequence. N≥2 and N is a positive integer. An extending direction of each encapsulation sub-region is identical to an extending direction of the encapsulation region CC. The first direction points from the display region AA to the encapsulation region CC.

A contact area between at least the $1^{st}$ encapsulation sub-region a1 and the encapsulant 14 is smaller than a contact area between any other encapsulation sub-region and the encapsulant 14.

In this embodiment, the $1^{st}$ encapsulation sub-region a1 refers to the encapsulation sub-region which is closest to the display region AA, and the $N^{th}$ encapsulation sub-region aN refers to the encapsulation sub-region farthest from the display region AA. Since the contact area between at least the $1^{st}$ encapsulation sub-region a1 and the encapsulant 14 is smaller than the contact area between any other encapsulation sub-region and the encapsulant 14, a bonding force between at least the $1^{st}$ encapsulation sub-region a1 and the encapsulant 14 is smaller than the bonding force between any other encapsulation sub-region and the encapsulant 14. Stress is transferred to the encapsulant 14 when the display panel is subject to an external impact or a fall. In one embodiment, an encapsulation sub-region having a lower bonding force, e.g., the $1^{st}$ encapsulation sub-region a1, can serve as a stress buffering region, and the stress can spread further away from the display region AA. Hence, the stress would not accumulate at a side of the encapsulant 14 facing the display region AA, which prevents cracks generated at the side of the encapsulant 14 facing the display region AA. The cover plate 11 is less likely to break, and strength of the display panel is improved.

Figure 7:
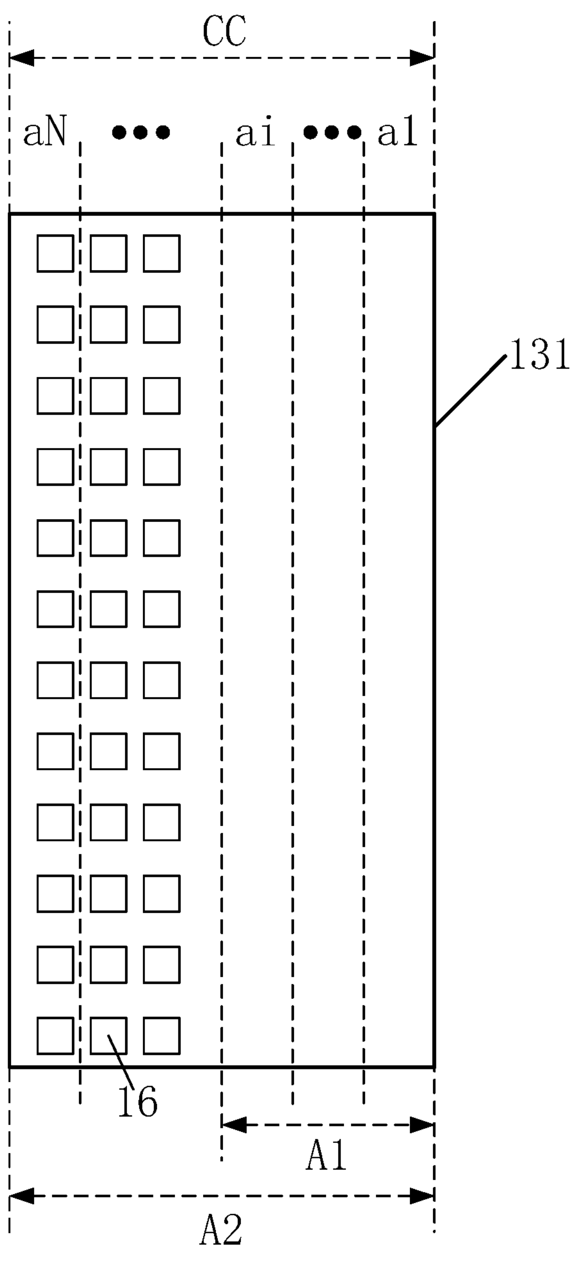
FIG. 7 is a schematic top view of a part of a dielectric layer in an encapsulation region according to another embodiment of the present disclosure.

Reference is made to FIG. 7, which is a schematic top view of a part of a dielectric layer in the encapsulation region according to another embodiment. The dielectric layer 13 in each of the $1^{st}$ encapsulation sub-region, a1, to an $i^{th}$ encapsulation sub-region, ai, is a flat film. The dielectric layer 13 in each of the $(i+1)^{th}$ encapsulation sub-region to the $N^{th}$ encapsulation sub-region, aN, has a hole 16. $1<i<N$, and i is a positive integer.

Along the first direction, a total width of the $1^{st}$ encapsulation sub-region a1 to the $i^{th}$ encapsulation sub-region ai is A1, and a width of the encapsulation region CC is A2. There is $A1 \leq \frac{2}{3} \times A2$.

Herein the dielectric layer in each of the $1^{st}$ encapsulation sub-region a1 to the $i^{th}$ encapsulation sub-region ai, which are close to the display region AA, is a flat film, and the dielectric layer 13 in each of the $(i+1)^{th}$ encapsulation sub-region to the $N^{th}$ encapsulation sub-region aN has one or more holes 16. In case of $A1 \leq \frac{2}{3} \times A2$, a bonding force between the $1^{st}$ to the $i^{th}$ encapsulation sub-regions, i.e., a1 to ai, and the encapsulant 14 may be smaller than a bonding force between the $(i+1)^{th}$ to $N^{th}$ encapsulation sub-regions and the encapsulant 14. Hence, the $1^{st}$ encapsulation sub-region a1 to the $i^{th}$ encapsulation sub-region ai can serve as the stress buffering region, which permits the stress to spread further away from the display region AA. Hence, the stress would not accumulate at a side of the encapsulant 14 facing the display region AA, which prevents cracks generated at the side of the encapsulant 14 facing the display region AA. The cover plate 11 is less likely to break, and strength of the display panel is improved.

In one embodiment, the holes in the $(i+1)^{th}$ encapsulation sub-region to the $N^{th}$ encapsulation sub-region aN can improve the bonding force between the encapsulant 14 and the dielectric layer 13, and to improve the encapsulation strength between the encapsulant 14 and the dielectric layer 13. That is, even when large stress causes disengagement between a part of the $1^{st}$ to $i^{th}$ encapsulation sub-regions and the encapsulant 14, the dielectric layer 13 and the encapsulant 14 in the $(i+1)^{th}$ to $N^{th}$ encapsulation sub-regions would not be completely disengaged due to the strong bonding force between the two.

In an embodiment, A1≤⅔×A2 is necessary to ensure good stress buffering and a good encapsulation effect. Assuming a width of the region 131 is fixed, A1>⅔×A2 may indicate that the total width of the encapsulation sub-regions serving as the stress buffering region may be too large while a total width of other encapsulation sub-regions having holes 16 is too small. In one embodiment, large stress may result in total disengagement between the dielectric layer 13 and the encapsulant 14.

Figure 8:
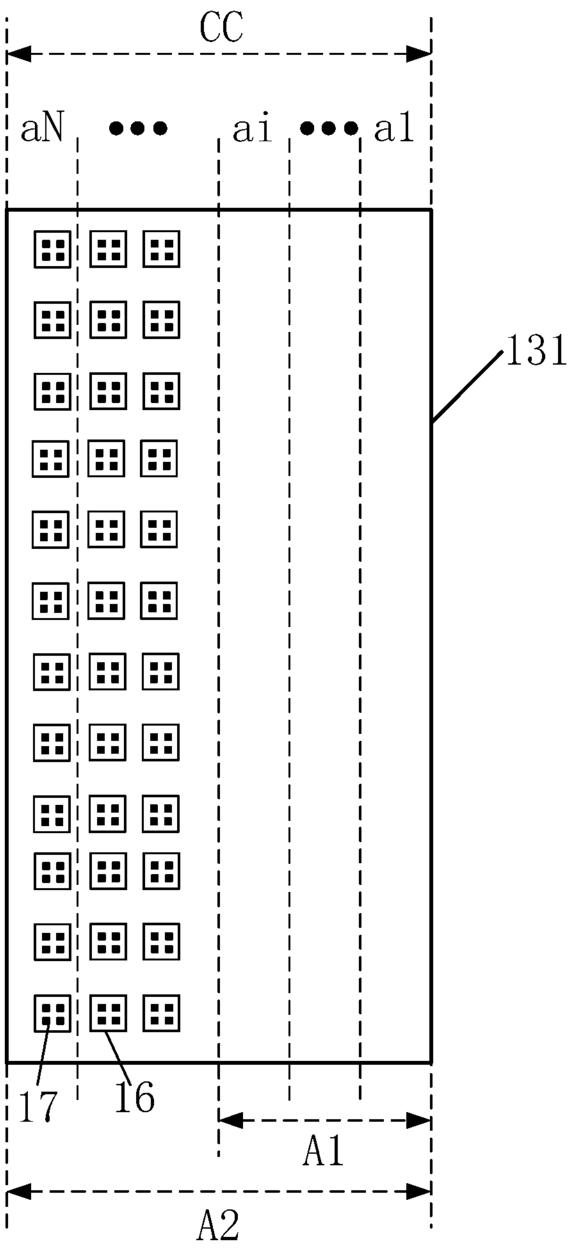
FIG. 8 is a schematic top view of a part of a dielectric layer in an encapsulation region according to another embodiment of the present disclosure.

Reference is made to FIG. 8, which is a schematic top view of a part of a dielectric layer in the encapsulation region according to another embodiment of the present disclosure. There are protrusion(s) 17, of which a quantity is equal to B, arranged at intervals in the hole 16. B is equal to 0, or is a positive integer.

In a case that B is equal to 0, there is no protrusion 17 in the hole 16, as shown in FIG. 7. In a case that B is a positive integer, there is at least one protrusion 17 in the hole 16, as shown in FIG. 8. The protrusion 17 can further increase the contact area between the encapsulation sub-region having the hole 16 and the encapsulant 14, and hence can further improve the bonding force between the encapsulation sub-region having the hole 16 and the encapsulant 14. Both the stress buffering and the encapsulation effect are improved, which prevents complete disengagement between the dielectric layer 13 and the encapsulant 14.

In FIG. 8, it is taken as an example that there are four protrusions 17 in each hole 16. A quantity of protrusions 17 in each hole 16 may be determined according to an actual situation, and is not limited herein.

The embodiments as shown in FIG. 8 has a better encapsulation effect than that as shown in FIG. 7. The embodiments as shown in FIG. 7 has lower bonding force between the encapsulation sub-regions having the holes 16 and the encapsulant 14 than that as shown in FIG. 8, and hence the stress can spread further away from the display region AA. In such perspective, risks of breaking the cover plate 11 are further reduced.

Figure 9:
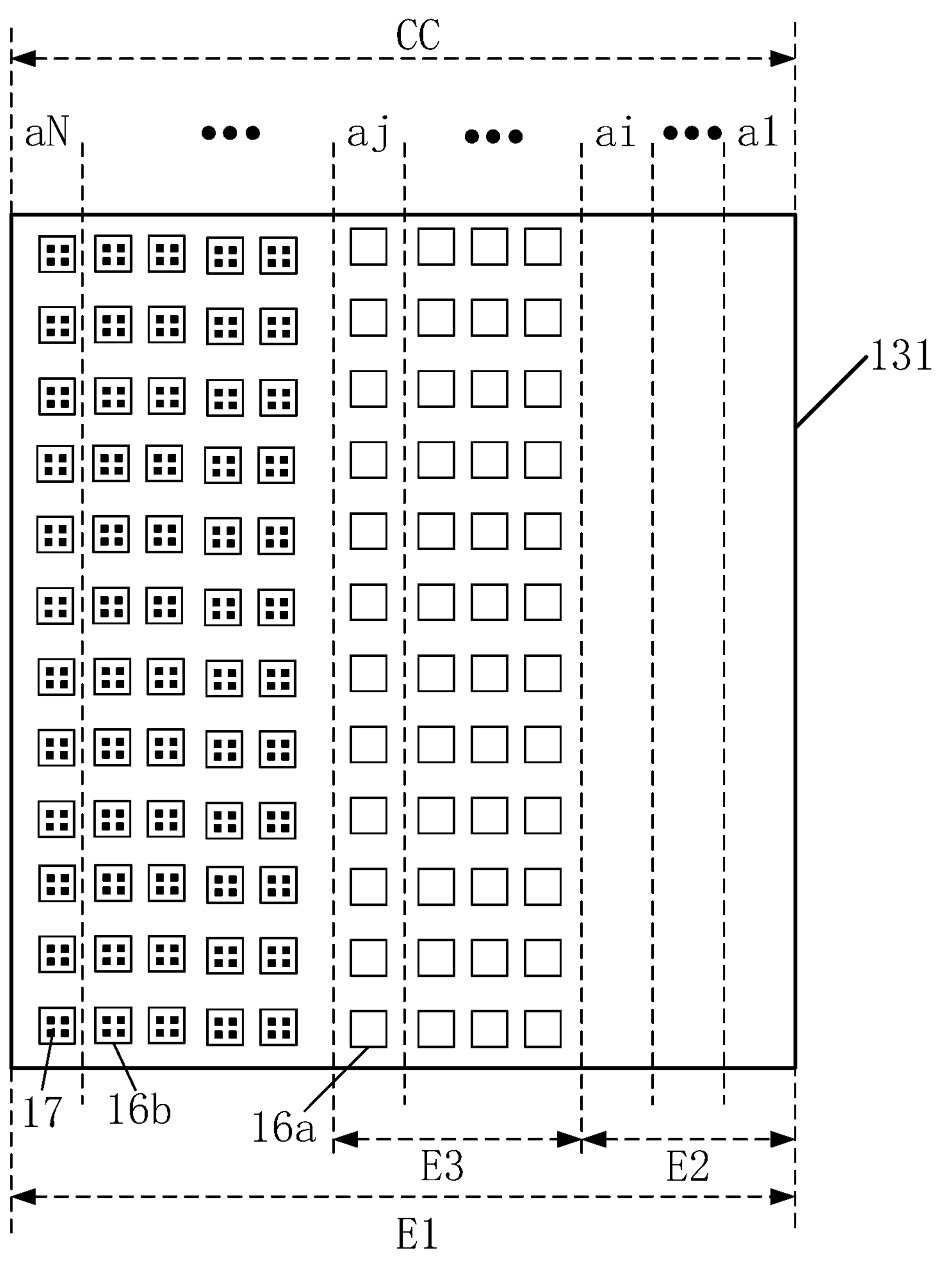
FIG. 9 is a schematic top view of a part of a dielectric layer in an encapsulation region according to another embodiment of the present disclosure.

Reference is made to FIG. 9, which is a schematic top view of a part of a dielectric layer in the encapsulation region according to another embodiment of the present disclosure. The dielectric layer 13 in each of the $1^{st}$ encapsulation sub-region a1 to the $i^{th}$ encapsulation sub-region ai is a flat film. The dielectric layer 13 in each of the $(i+1)^{th}$ encapsulation sub-region to a $j^{th}$ encapsulation sub-region, aj, has a first hole 16*a*. The dielectric layer 13 in each of the $(j+1)^{th}$ encapsulation sub-region to the $N^{th}$ encapsulation sub-region, aN, has a second hole 16*b*. 1<i<j<N, and i and j are positive integers.

The first hole 16*a* has protrusion(s) 17, of which a quantity is equal to C, arranged at intervals. The second hole 16*b* has protrusion(s) 17, of which a quantity is equal to D arranged at intervals. C is equal to 0 and D is a positive integer.

Along the first direction, a width of the encapsulation region CC is E1, a total width of the $1^{st}$ encapsulation sub-region a1 to the $i^{th}$ encapsulation sub-region ai is E2, and a total width of the $(i+1)^{th}$ encapsulation sub-region to the $i^{th}$ encapsulation sub-region aj is E3.

There is E2≤⅓×E1, E3≤⅓×E1.

Herein the dielectric layer in the $1^{st}$ to $i^{th}$ encapsulation sub-regions, which are close to the display region AA, is a flat film, the dielectric layer 13 in each of the $(i+1)^{th}$ to $j^{th}$ encapsulation sub-regions has one or more first holes 16*a*, the dielectric layer 13 in each of the $(j+1)^{th}$ to $N^{th}$ encapsulation sub-regions has one or more second holes 16*b*, and there is at least one protrusion 17 in each second hole 16*b*. In case of E2≤⅓×E1 and E3≤⅓×E1, a bonding force between the $1^{st}$ to $i^{th}$ encapsulation sub-regions and the encapsulant 14 may be smaller than a bonding force between the $(i+1)^{th}$ to $j^{th}$ encapsulation sub-regions and the encapsulant 14, and the latter may be further smaller than a bonding force between the $(j+1)^{th}$ to $N^{th}$ encapsulation sub-regions and the encapsulant 14. In one embodiment, the $1^{st}$ encapsulation sub-region a1 to the $i^{th}$ encapsulation sub-region ai can serve as a first stress buffering region, and the $(i+1)^{th}$ encapsulation sub-region to the $j^{th}$ encapsulation sub-region aj can serve as a second stress buffering region. The two progressive stress buffering regions can permit the stress to spread further away from the display region AA. Hence, the stress would not accumulate at a side of the encapsulant 14 facing the display region AA, which prevents cracks generated at the side of the encapsulant 14 facing the display region AA. The cover plate 11 is less likely to break, and strength of the display panel is improved.

In one embodiment, the at least one protrusion 17 is provided in the second hole 16*b* from the $(j+1)^{th}$ encapsulation sub-region to $N^{th}$ encapsulation sub-region, to enhance the bonding force between the $(j+1)^{th}$ to $N^{th}$ encapsulation sub-regions and the encapsulant 14. Even large stress would not result in complete disengagement between the encapsulant 14 and the dielectric layer 13. Both the stress buffering and the encapsulation effect are ensured.

Figure 10:
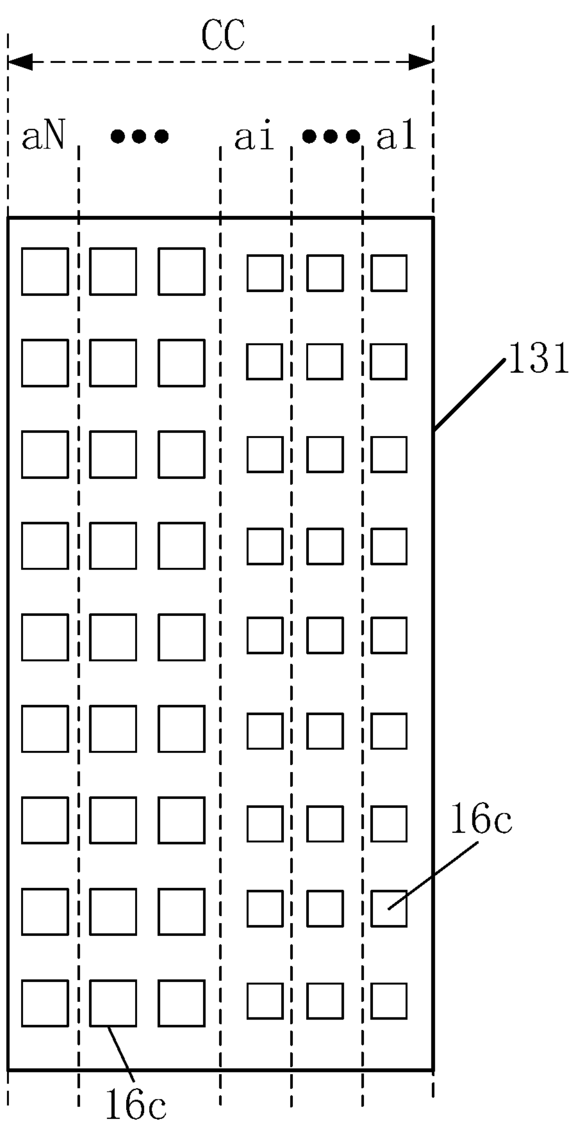
FIG. 10 is a schematic top view of a part of a dielectric layer in the encapsulation region according to another embodiment of the present disclosure.

Reference is made to FIG. 10, which is a schematic top view of a part of a dielectric layer in the encapsulation region according to another embodiment of the present disclosure. Each encapsulation sub-region has multiple third holes 16*c* arranged at intervals along a second direction. The second direction is identical to the extending direction of the encapsulation region CC.

An area of an orthographic projection of the third hole 16*c* on the substrate 12, in each of the $1^{st}$ encapsulation sub-region a1 to the $i^{th}$ encapsulation sub-region ai, is smaller than that in each of the $(i+1)^{th}$ encapsulation sub-region to the $N^{th}$ encapsulation sub-region aN. 1≤i<N, and i is a positive integer.

Herein each encapsulation sub-region has the third hole 16*c*, which can improve a bonding force between the whole region 131 and the encapsulant 14. The area of the orthographic projection area of the third hole 16*c* on the substrate 12, in each of the $1^{st}$ encapsulation sub-region a1 to the in the encapsulation sub-region ai, is smaller than that in each of the $(i+1)^{th}$ encapsulation sub-region to the $N^{th}$ encapsulation sub-region aN. In one embodiment, the bonding force between the $1^{st}$ to encapsulation $i^{th}$ sub-regions and the encapsulant 14 is smaller than the bonding force between the $(i+1)^{th}$ to $N^{th}$ encapsulation sub-regions and the encapsulant 14. Hence, the $1^{st}$ encapsulation sub-region a1 to the $i^{th}$ encapsulation sub-region ai can serve as the stress buffering region, which permits the stress to spread further away from the display region AA. Hence, the stress would not accumulate at a side of the encapsulant 14 facing the display region AA, which prevents cracks generated at the side of the encapsulant 14 facing the display region AA. The cover plate 11 is less likely to break, and strength of the display panel is improved.

In one embodiment, a density of the third holes 16*c* in each of the $1^{st}$ encapsulation sub-region a1 to the $i^{th}$ encapsulation sub-region ai is smaller than a density of the third holes 16*c* in each of the $(i+1)^{th}$ encapsulation sub-region to the $N^{th}$ encapsulation sub-region aN. $1 \leq i < N$, and i is a positive integer.

Herein each encapsulation sub-region has the third hole 16*c*, which can improve the bonding force between the whole region 131 and the encapsulant 14. The density of the third holes 16*c* in each of the $1^{st}$ encapsulation sub-region a1 to the $i^{th}$ encapsulation sub-region ai is smaller than the density of the third holes 16*c* in the $(i+1)^{th}$ encapsulation sub-region to the $N^{th}$ encapsulation sub-region aN. In one embodiment, the bonding force between the $1^{st}$ to $i^{th}$ encapsulation sub-regions and the encapsulant 14 is also smaller than the bonding force between the $(i+1)^{th}$ to $N^{th}$ encapsulation sub-regions and the encapsulant 14. Hence, the $1^{st}$ encapsulation sub-region a1 to the $i^{th}$ encapsulation sub-region ai can serve as the stress buffering region, which permits the stress to spread further away from the display region AA. Hence, the stress would not accumulate at a side of the encapsulant 14 facing the display region AA, which prevents cracks generated at the side of the encapsulant 14 facing the display region AA. The cover plate 11 is less likely to break, and strength of the display panel is improved.

Figure 11:
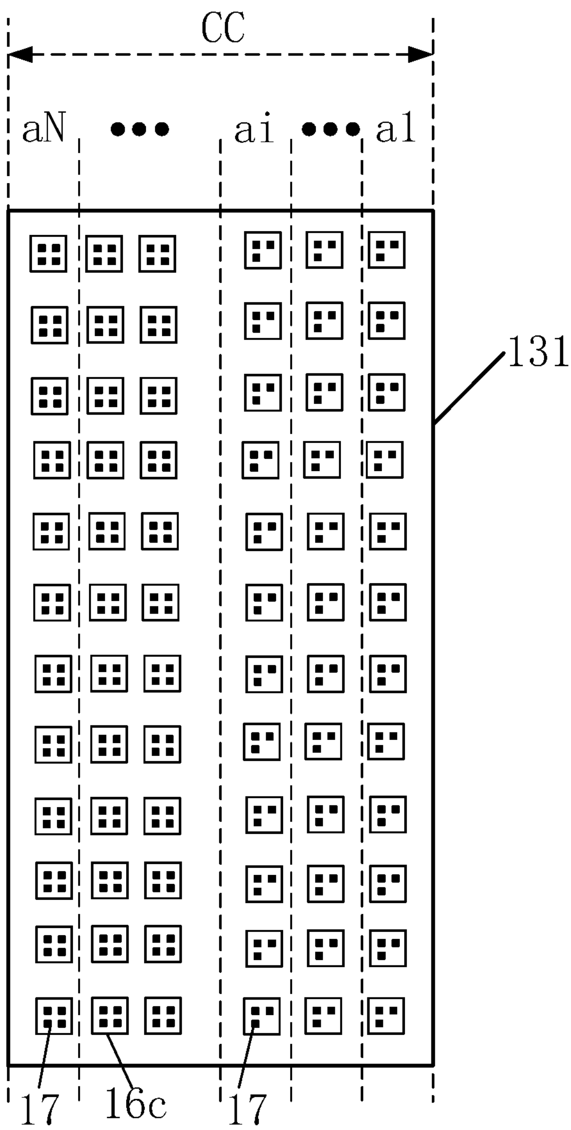
FIG. 11 is a schematic top view of a part of a dielectric layer in an encapsulation region according to another embodiment of the present disclosure.

Reference is made to FIG. 11, which is a schematic top view of a part of a dielectric layer in the encapsulation region according to another embodiment of the present disclosure. Protrusion(s) 17, of which a quantity is equal to F, arranged at intervals are disposed in the third hole 16*c* in each of the $1^{st}$ encapsulation sub-region a1 to the $i^{th}$ encapsulation sub-region ai.

Protrusion(s) 17, of which a quantity is equal to G, arranged at intervals are disposed in the third hole 16*c* in each of the $(i+1)^{th}$ encapsulation sub-region to the $N^{th}$ encapsulation sub-region aN.

$1 \leq i < N$, and i is a positive integer. F is equal to 0, or F is a positive integer. G is a positive integer, and there is $G > F$.

In FIG. 11, F is a positive integer, and it is taken as example that F=3 and G=4.

Herein each encapsulation sub-region includes the third hole 16*c*, and the protrusions 17 may be disposed in the third hole 16*c* in a selective manner, which improves the bonding force between the whole region 131 and the encapsulant 14. $G > F$ includes that F is equal to 0 or F is a positive integer. That is, less protrusions 17 are configured in the third hole 16*c* in each of the $1^{st}$ encapsulation sub-region a1 to the $i^{th}$ encapsulation sub-region ai, and hence the bonding force between the $1^{st}$ to $1^{st}$ encapsulation sub-regions and the encapsulant 14 is also smaller than the bonding force between the $(i+1)^{th}$ to $N^{th}$ encapsulation sub-regions and the encapsulant 14. Hence, the $1^{st}$ encapsulation sub-region a1 to the $i^{th}$ encapsulation sub-region ai can serve as the stress buffering region, which permits the stress to spread further away from the display region AA. Hence, the stress would not accumulate at a side of the encapsulant 14 facing the display region AA, which prevents cracks generated at the side of the encapsulant 14 facing the display region AA. The cover plate 11 is less likely to break, and strength of the display panel is improved.

Figure 12:
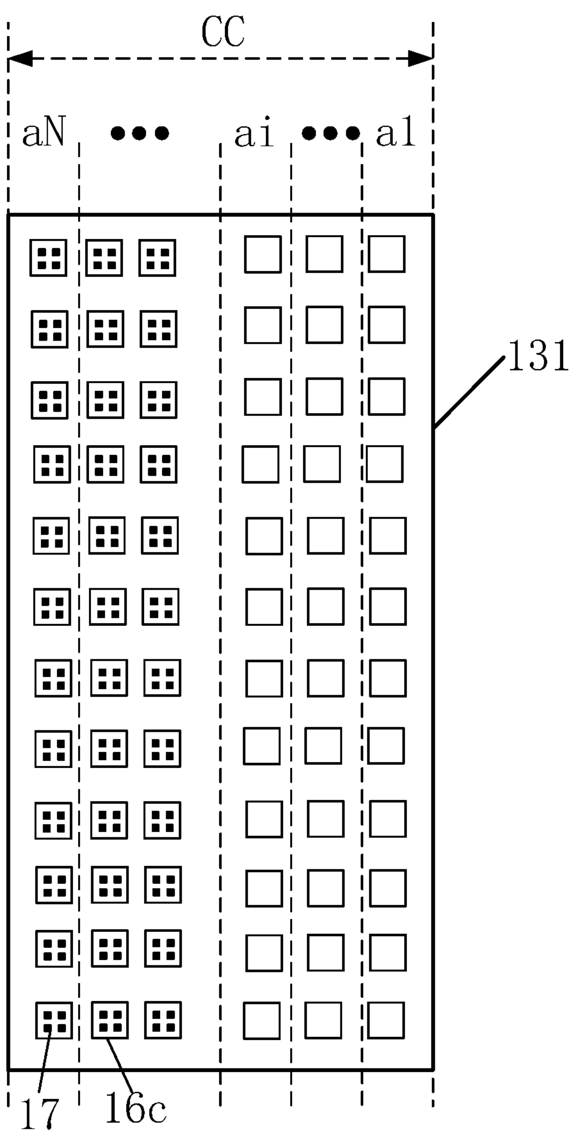
FIG. 12 is a schematic top view of a part of a dielectric layer in an encapsulation region according to another embodiment of the present disclosure.

Reference is to FIG. 12, which is a schematic top view of a part of a dielectric layer in the encapsulation region according to another embodiment of the present disclosure. $i > 1$ and F=0. Along the first direction, a total width of the $1^{st}$ encapsulation sub-region a1 to the $i^{th}$ encapsulation sub-region ai is H3, and a total width of the $1^{st}$ encapsulation sub-region a1 to the $N^{th}$ encapsulation sub-region aN is H4. There is $H3 \leq 3/5 \times H4$.

Herein the dielectric layer 13 in each of the $1^{st}$ encapsulation sub-region a1 to the $i^{th}$ encapsulation sub-region ai has a third hole 16*c*, there are protrusion(s) 17, of which a quantity is F, in the third hole 16*c*. The dielectric layer 13 in each of the $(i+1)^{th}$ encapsulation sub-region to the $N^{th}$ encapsulation sub-region aN also has the third hole 16*c*, and there are protrusion(s) 17, of which a quantity is G, in the third hole 16*c*. F=0, and G is a positive integer. That is, no protrusion 17 is configured in the third hole 16*c* in each of the $1^{st}$ encapsulation sub-region a1 to the encapsulation sub-region ai, and hence the bonding force between the $1^{st}$ to $i^{th}$ encapsulation sub-regions and the encapsulant 14 is smaller than the bonding force between the $(i+1)^{th}$ to $N^{th}$ encapsulation sub-regions and the encapsulant 14. Hence, the $1^{st}$ encapsulation sub-region a1 to the $i^{th}$ encapsulation sub-region ai can serve as the stress buffering region, which permits the stress to spread further away from the display region AA. Hence, the stress would not accumulate at a side of the encapsulant 14 facing the display region AA, which prevents cracks generated at the side of the encapsulant 14 facing the display region AA. The cover plate 11 is less likely to break, and strength of the display panel is improved.

The bonding force between the encapsulation sub-regions and the encapsulant 14 may be reduced due to the removal of the protrusion 17 from the third hole 16*c*. Hence, it may be configured that $H3 \leq 3/5 \times H4$. In one embodiment, even large stress would not result in complete disengagement between the encapsulant 14 and the dielectric layer 13. Both the stress buffering and the encapsulation effect are ensured.

In other words, the protrusions 17 in the third holes 16*c* in encapsulation sub-regions close to the display region AA are removed. The removal starts from the $1^{st}$ encapsulation sub-region a1. That is, the protrusions 17 in the third holes 16*c* in both the $1^{st}$ encapsulation sub-region a1 and the $2^{nd}$ encapsulation sub-region may be removed, or protrusions 17 in the third holes 16*c* in all of the $1^{st}$ encapsulation sub-region a1, the $2^{nd}$ encapsulation sub-region, and the $3^{rd}$ encapsulation sub-region may be removed. A total width of the encapsulation sub-regions, from which the protrusions 17 are removed, shall not be too large and need to meet $H3 \leq 3/5 \times H4$, to avoid reducing encapsulation performances between the encapsulant 14 and the dielectric layer 13 too much.

Figure 13:
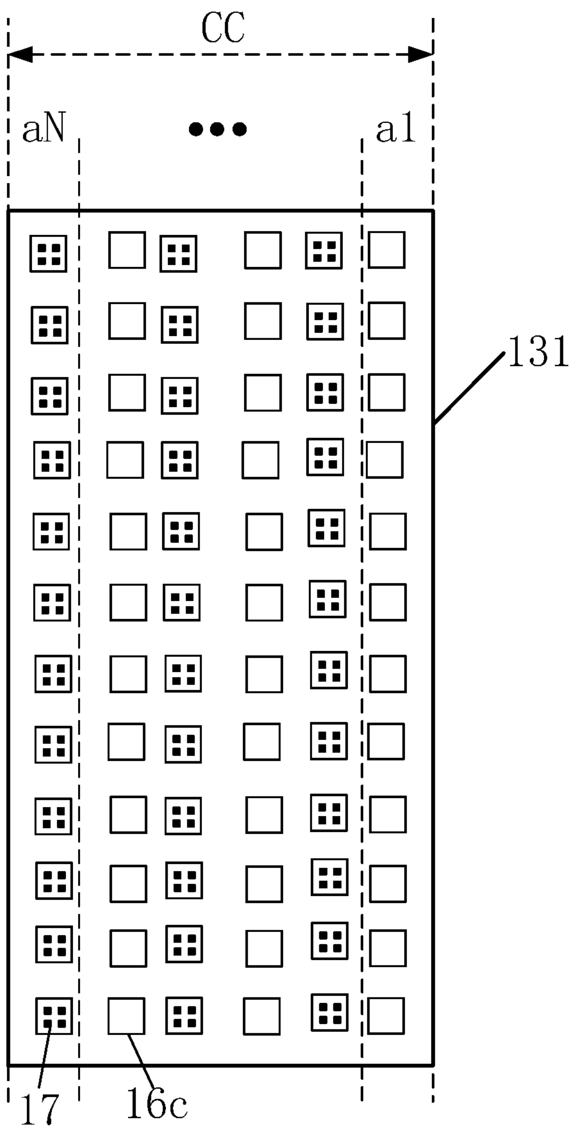
FIG. 13 is a schematic top view of a part of a dielectric layer in an encapsulation region according to another embodiment of the present disclosure.

Reference is made to FIG. 13, which is a schematic top view of a part of a dielectric layer in the encapsulation region according to another embodiment of the present disclosure. The third hole 16*c* in each encapsulation sub-region having an odd sequential number has protrusion(s) 17, of which a quantity is equal to F, arranged at intervals. The third hole 16*c* in each encapsulation sub-region having an even sequential number has protrusion(s) 17, of which a quantity is equal to G, arranged at intervals.

F is equal to 0, or F is a positive integer. G is a positive integer, and there is $G > F$.

Figure 3:
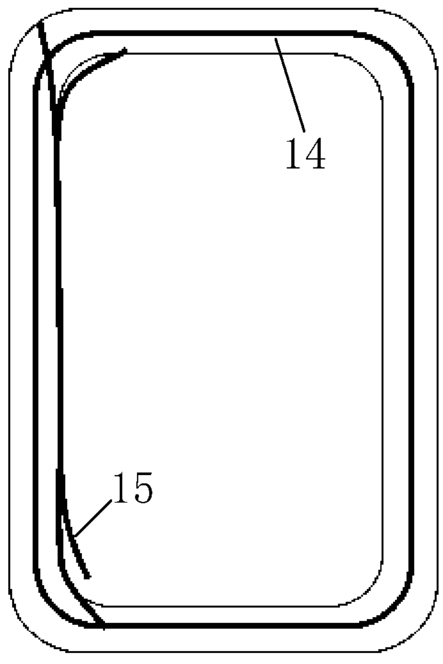
FIG. 3 is a top view of a rectangular display panel.

In FIG. 3, it is taken as an example that F=0 and G=4.

Herein each encapsulation sub-region includes the third hole 16*c*, and the protrusions 17 may be disposed in the third hole 16*c* in a selective manner, which improves the bonding force between the whole region 131 and the encapsulant 14. $G > F$ includes that F is equal to 0 or F is a positive integer. That is, less protrusions 17 are configured in the third hole 16*c* in each odd-numbered encapsulation sub-region, and hence a bonding force between the odd-numbered encapsulation sub-regions and the encapsulant 14 is smaller than the bonding force between the even-numbered encapsulation sub-regions and the encapsulant 14. Herein, the odd-numbered encapsulation sub-region can serve as the stress buffering region, and the even-numbered encapsulation sub-region may serve as a stress consuming region. For example, N=6, the $1^{st}$ encapsulation sub-region a1, the $3^{rd}$ encapsulation sub-region, and the $5^{th}$ encapsulation sub-region serve as the stress buffering region, the $2^{nd}$ encapsulation sub-region, the $4^{th}$ encapsulation sub-regions, and the $6^{th}$ encapsulation sub-region serve as the stress consuming regions. Since that stress buffering regions and the stress consuming regions are alternately arranged, the stress are buffered and consumed alternately during its transfer, which permits the stress to spread further away from the display region AA. Hence, the stress would not accumulate at a side of the encapsulant 14 facing the display region AA, which prevents cracks generated at the side of the encapsulant 14 facing the display region AA. The cover plate 11 is less likely to break, and strength of the display panel is improved.

Figure 14:
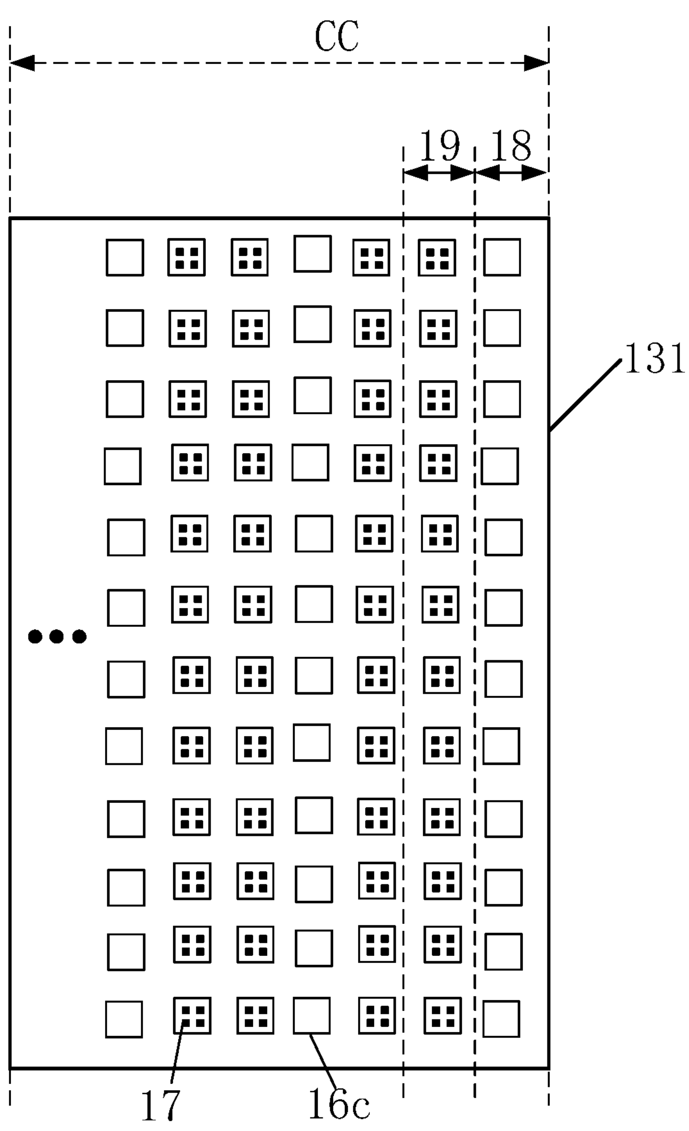
FIG. 14 is a schematic top view of a part of a dielectric layer in an encapsulation region according to another embodiment of the present disclosure.

Reference is made to FIG. 14, which is a schematic top view of a part of a dielectric layer in the encapsulation region according to another embodiment of the present disclosure. N encapsulation sub-regions include multiple first-type encapsulation sub-regions 18 and multiple second-type encapsulation sub-regions 19. The third hole 16*c* in each first-type encapsulation sub-region 18 has protrusion(s) 17, of which a quantity is equal to F, arranged at intervals. The third hole 16*c* in each second-type encapsulation sub-region 19 has protrusion(s) 17, of which a quantity is equal to G, arranged at intervals. F is equal to 0, or F is a positive integer. G is a positive integer, and there is G>F.

Along the first direction, at least one second-type encapsulation sub-region 19 is disposed between every pair of two adjacent first-type encapsulation sub-regions 18.

The $1^{st}$ encapsulation sub-region a1 belongs to the first-type encapsulation sub-regions 18.

In FIG. 14, it is taken as an example that F=0 and G=4 and two second-type encapsulation sub-regions 19 are disposed between every pair of two adjacent first-type encapsulation sub-regions 18.

Herein each encapsulation sub-region includes the third hole 16*c*, and the protrusions 17 may be disposed in the third hole 16*c* in a selective manner, which improves the bonding force between the whole region 131 and the encapsulant 14. G>F includes that F is equal to 0 or F is a positive integer. That is, less protrusions 17 are configured in the third hole 16*c* in each first-type encapsulation sub-region, and hence a bonding force between the first-type encapsulation sub-regions and the encapsulant 14 is smaller than the bonding force between the second-type encapsulation sub-regions and the encapsulant 14. Herein, the first-type encapsulation sub-region can serve as the stress buffering region, and the second-type encapsulation sub-region may serve as the stress consuming region. Such configuration enables the stress to be buffered and consumed during its transfer, which permits the stress to spread further away from the display region AA. Hence, the stress would not accumulate at a side of the encapsulant 14 facing the display region AA, which prevents cracks generated at the side of the encapsulant 14 facing the display region AA. The cover plate 11 is less likely to break, and strength of the display panel is improved.

Figure 15:
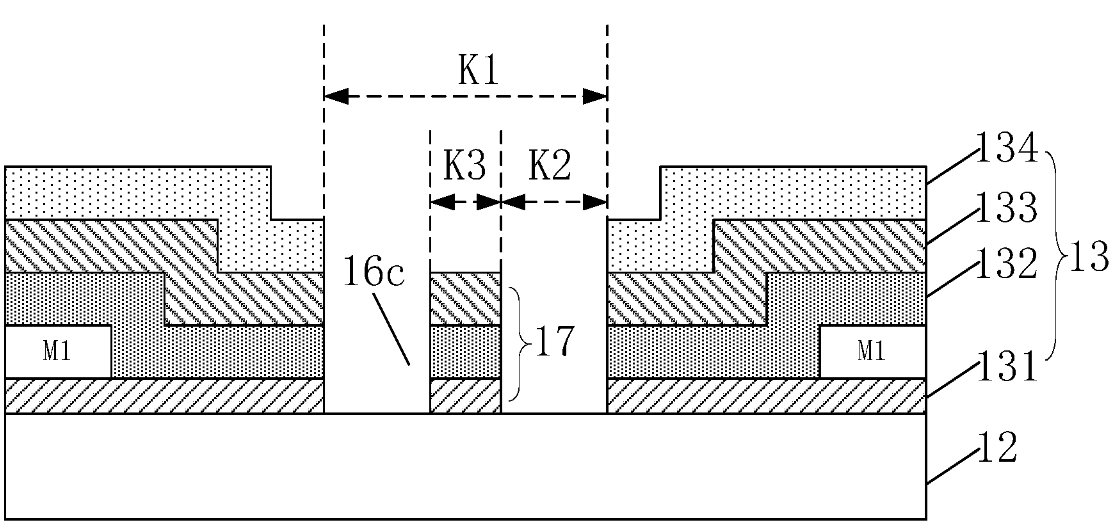
FIG. 15 is a schematic cross-sectional view of a third hole according to an embodiment of the present disclosure.

Reference is made to FIG. 15, which is a schematic cross-sectional view of a third hole according to an embodiment of the present disclosure. As shown in FIG. 15, the dielectric layer 13 may include a first inorganic layer 131, a second inorganic layer 132, a third inorganic layer 133, and an organic layer 134. A first metal layer M1 is disposed between the first inorganic layer 131 and the second inorganic layer 132. In some embodiments, the dielectric layer 13 may be a part of the array layer 12. Taking F=1 as an example, along the first direction, a width of the third hole 16*c* in each of the $1^{st}$ encapsulation sub-region a1 to the $i^{th}$ encapsulation sub-region ai is K1, a distance between the protrusion 17 in the third hole 16*c* and an edge of the third hole 16*c* is K2, and a width of the protrusion 17 is K3.

There are $\frac{1}{9}\times K1 \leq K3 \leq \frac{1}{3}\times K1$, and $K2=\frac{1}{2}\times(K1-K3)$.

Herein F=1 indicates that there is one protrusion 17 in the third hole 16*c* in each of the $1^{st}$ encapsulation sub-region a1 to the $i^{th}$ encapsulation sub-region ai, and there are G protrusions 17 in the third hole 16*c* in each of the $(i+1)^{th}$ encapsulation sub-region to the $N^{th}$ encapsulation sub-region aN. The bonding force between the $1^{st}$ to $i^{th}$ encapsulation sub-regions and the encapsulant 14 is less than the bonding force between the $(i+1)^{th}$ to $N^{th}$ encapsulation sub-regions and the encapsulant 14. Hence, the $1^{st}$ encapsulation sub-region a1 to the $i^{th}$ encapsulation sub-region ai can serve as the stress buffering region, which permits the stress to spread further away from the display region AA. Hence, the stress would not accumulate at a side of the encapsulant 14 facing the display region AA, which prevents cracks generated at the side of the encapsulant 14 facing the display region AA. The cover plate 11 is less likely to break, and strength of the display panel is improved.

In one embodiment, when $\frac{1}{9}\times K1 \leq K3 \leq \frac{1}{3}\times K1$, and $K2=\frac{1}{2}\times(K1-K3)$, the bonding force between the $1^{st}$ to $i^{th}$ encapsulation sub-regions and the encapsulant 14 would not be too low, to avoid disengagement between the encapsulant 14 and the dielectric layer 13.

Figure 16:
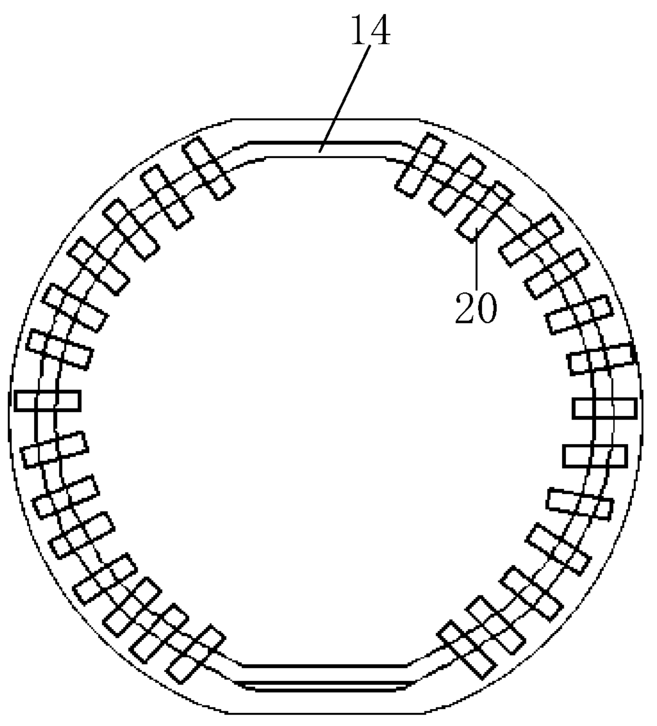
FIG. 16 is a schematic top view of a display panel according to another embodiment of the present disclosure.
Figure 17:
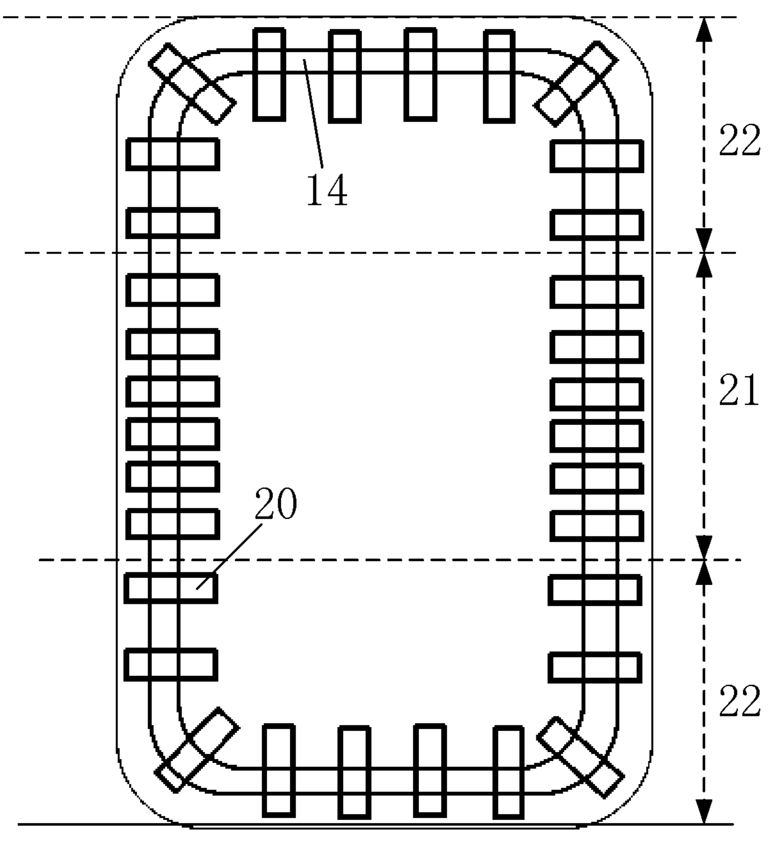
FIG. 17 is a schematic top view of a display panel according to another embodiment of the present disclosure.

Referring is made to FIG. 16 and FIG. 17, each of which is a top view of a display panel according to another embodiment of the present disclosure. The display panel further includes multiple first grooves 20 in the encapsulation region CC.

The first grooves 20 are sequentially arranged along the extending direction of the encapsulation region CC. A lengthwise direction of each first groove 20 is not parallel with the extending direction of the encapsulation region CC.

In one embodiment, the first grooves 20 are located on a surface of the dielectric layer 13 facing the cover plate 11, and/or a surface of the cover plate 11 facing the dielectric layer 13. The first groove 20 extending in a direction perpendicular to possible cracks can prevent the cracks from extending. Therefore, even if cracks appear in the display panel under stress, the cracks would not grow and are confined in a tiny region. Damages to the display panel are greatly reduced, and the strength of the display panel is improved.

As shown in FIG. 17, the display panel is rectangular, and the display panel is divided into a middle region 21 and edge region s 22 on two sides of the middle region 21 along the a lengthwise direction of the rectangle.

A density of the first grooves 20 in the middle region 21 is greater than a density of the first grooves 20 in each edge regions 22.

Herein the middle region 21 is subject to greater stress that the edge region 22 during stress transmission. Hence, the density of the first grooves 20 in the middle region 21 being greater than that in the edge area 22 can prevent extension of the cracks to the greatest extent, and the cracks are confined in a tiny region. Damages to the display panel are greatly reduced, and the strength of the display panel is improved.

Figure 18:
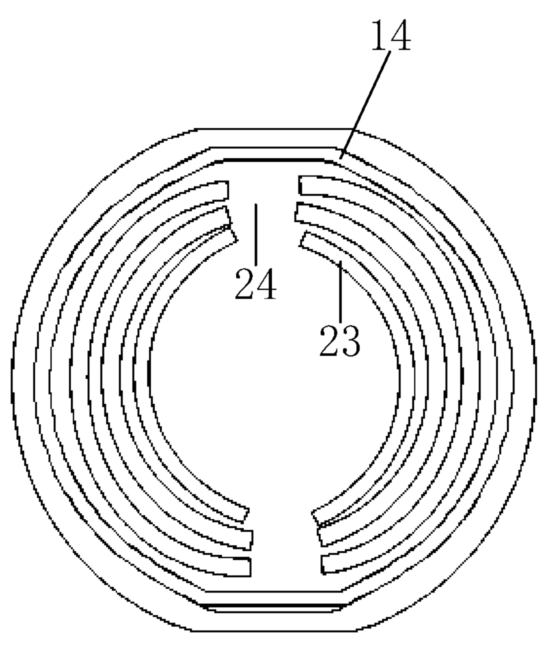
FIG. 18 is a schematic top view of a display panel according to another embodiment of the present disclosure.

In one embodiment, referring to FIG. 18, which is a top view of a display panel according to another embodiment of the present disclosure, the non-display BB includes a part located between the encapsulation region CC and the display region AA.

Multiple second grooves 23 are located in the part of the non-display BB.

The second grooves 23 are sequentially arranged along the first direction, and a lengthwise direction of the second grooves 23 is identical to the extending direction of the encapsulation region CC.

In one embodiment, the second groove 23 is located at a surface of the dielectric layer 13 facing the cover plate 11, and/or a surface of the cover plate 11 facing the dielectric layer 13. The second groove 23 extending along a transmission direction of the stress permits the stress to be reduced gradually during its transfer. Hence, the stress borne by the encapsulation region CC is reduced, and the strength of the display panel is improved.

In FIG. 18, an opening region 24 is provided among the second grooves 23 for wiring of the display panel.

Figure 19:
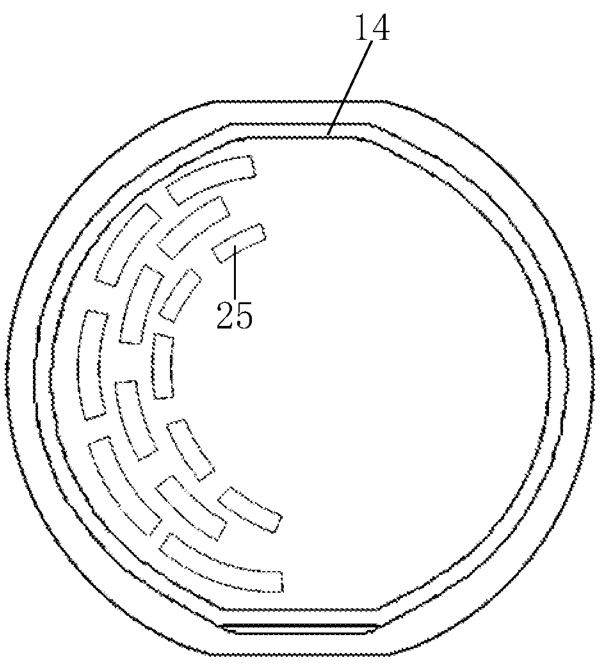
FIG. 19 is a schematic top view of a display panel according to another embodiment of the present disclosure.

Reference is made to FIG. 19, which is a schematic top view of a display panel according to another embodiment of the present disclosure. Each second groove 23 includes multiple groove units 25 independent from each other.

The groove units 25 of a second groove 23 and the groove units 25 of an adjacent second groove 23 are arranged in a staggered manner.

Herein the second groove 23 extending along the transmitting direction of the stress may be divided into the multiple independent groove units 25 as a pattern design. The groove unit 25 in an outer groove corresponds to a gap between two adjacent groove units 25 in an adjacent inner groove, which facilitates dissipation of the stress that spreads outward. Hence, the stress borne by the encapsulation region CC is reduced, and the strength of the display panel is improved.

FIG. 19 only shows a part of the groove units 25, and other groove units 25 in remaining regions may be arranged in a similar manner.

The foregoing embodiments also apply to the rectangular display panel according to the same principle, which would not be illustrated herein.

On a basis of the foregoing display panels, a display device is further provided according to embodiments of the present disclosure. The display device includes the display panel described in any foregoing embodiment.

The display device is capable to achieve the same effect as the display panel. For example, the display device may be a mobile phone or a wearable device.

Hereinabove the display panel and the display device are introduced in detail according to embodiments of the present disclosure, and some embodiments are used to illustrate principles and implementations of the present disclosure. The description of the above embodiments is only intended for understanding the method and some embodiments of the present disclosure. Modifications to specific implementations and the application scope can be made according to a concept of the present disclosure. In summary, the content of this description should not be understood as a limitation to the present disclosure.

The embodiments of the present disclosure are described in a progressive manner, and each embodiment places emphasis on the difference from other embodiments. Therefore, one embodiment can refer to other embodiments for the same or similar parts. Since the display devices disclosed in the embodiments corresponds to the display panels disclosed in the embodiments, the description of the display devices is simple, and reference may be made to the relevant part of the display panels.

It should be noted that, the relationship terms such as “first”, “second” and the like are only used herein to distinguish one entity or operation from another, rather than to necessitate or imply that an actual relationship or order exists between the entities or operations. Furthermore, the terms such as “include”, “comprise” or any other variants thereof means to be non-exclusive. Therefore, a process, a method, an article or a device including a series of elements include not only the disclosed elements but also other elements that are not clearly enumerated, or further include inherent elements of the process, the method, the article or the device. Unless expressively limited, the statement “including a . . . ” does not exclude the case that other similar elements may exist in the process, the method, the article or the device other than enumerated elements.

Various modifications made to these embodiments may be made, and the general principle defined herein may be implemented in other embodiments without departing from the spirit or scope of the present disclosure. Therefore, the present disclosure is not limited to the embodiments described herein but conforms to a widest scope in accordance with principles and novel features disclosed in the present disclosure.

What is claimed is:

1. A display panel, comprising:

a display region and a non-display region, wherein:

the non-display region comprises an encapsulation region, and an encapsulant is disposed in the encapsulation region; and the display panel further comprises:

a substrate an array layer disposed at a side of the substrate;

a dielectric layer disposed on a side of the array layer away from the substrate;

a cover plate disposed opposite to the dielectric layer, wherein the encapsulant is disposed between the dielectric layer and the cover plate;

the dielectric layer in the encapsulation region comprises N encapsulation sub-regions, which are from a 1st encapsulation sub-region to a $N^{th}$ encapsulation sub-region and arranged along a first direction according to ascending sequential numbers, N is a positive integer greater than or equal to 4, an extending direction of each of the encapsulation sub-regions is identical to an extending direction of the encapsulation region; and the $1^{st}$ encapsulation sub-region is among one or more encapsulation sub-regions, each of which has a smallest contact area with the encapsulant among the N encapsulation sub-regions, wherein the dielectric layer in each of the $1^{st}$ sub-region to an $i^{th}$ encapsulation sub-region is a flat film, the dielectric layer in each of an $(i+1)^{th}$ encapsulation sub-region to a $j^{th}$ encapsulation sub-region comprises first holes spaced apart along the extending direction, the dielectric region in each of a $(j+1)^{th}$ encapsulation sub-region to the $N^{th}$ encapsulation sub-region comprises second holes spaced apart along the extending direction, wherein i is a positive integer greater than 1 and smaller than j, and j is a positive integer smaller than N;

wherein no protrusion is disposed in the first holes, and one or more discrete protrusions are disposed in each of the second holes, and wherein a width E1 of the encapsulation region along the first direction, a total width E2 of the $1^{st}$ encapsulation sub-region to the $i^{th}$ encapsulation sub-region along the first direction, and a total width E3 of the $(i+1)^{th}$ encapsulation sub-region to the $j^{th}$ encapsulation sub-region along the first direction satisfy the following relationships: $E2 \leq 1/3 \times E1$, and $E3 \leq 1/3 \times E1$.

2. The display panel according to claim 1, wherein four discrete protrusions are disposed in each of the second holes at equal intervals in a two-dimensional array.

3. The display panel according to claim 1, wherein the second holes each contain one discrete protrusion, and for the discrete protrusion in each of the second holes in each of the $(j+1)^{th}$ encapsulation sub-region to the $N^{th}$ encapsulation sub-region:

a width K1 of said second hole along the first direction, a spacing K2 between said discrete protrusion in said second hole and an edge of said second hole along the first direction, and a width K3 of said discrete protrusion in said second hole along the first direction satisfy the following relationships: $1/6 \times K1 \leq K3 \leq 1/3 \times K1$, and $K2 = 1/2 \times (K1 - K3)$.

4. The display panel according to claim 1, wherein an area of an orthographic projection area of each of the first holes in each of the $(i+1)^{th}$ encapsulation sub-region to the $j^{th}$ encapsulation sub-region is smaller than an area of an orthographic projection area of each of the second holes in each of the $(j+1)^{th}$ encapsulation sub-region to the $N^{th}$ encapsulation sub-region; and/or wherein a density of the first holes in each of the $(i+1)^{th}$ encapsulation sub-region to the $j^{th}$ encapsulation sub-region is less than a density of the second holes in each of the $(j+1)^{th}$ encapsulation sub-region to the $N^{th}$ encapsulation sub-region.

5. A display device, comprising a display panel, comprising:

a display region and a non-display region, wherein:

the non-display region comprises an encapsulation region, and an encapsulant is disposed in the encapsulation region; and the display panel further comprises:

a substrate an array layer disposed at a side of the substrate;

a dielectric layer disposed on a side of the array layer away from the substrate;

a cover plate disposed opposite to the dielectric layer, wherein the encapsulant is disposed between the dielectric layer and the cover plate;

the dielectric layer in the encapsulation region comprises N encapsulation sub-regions, which are from a $1^{st}$ encapsulation sub-region to a $N^{th}$ encapsulation sub-region and arranged along a first direction according to ascending sequential numbers, N is a positive integer greater than or equal to 4, an extending direction of each of the encapsulation sub-regions is identical to an extending direction of the encapsulation region; and the $1^{st}$ encapsulation sub-region is among one or more encapsulation sub-regions, each of which has a smallest contact area with the encapsulant among the N encapsulation sub-regions, wherein the dielectric layer in each of the $1^{st}$ sub-region to an $i^{th}$ encapsulation sub-region is a flat film, the dielectric layer in each of an $(i+1)^{th}$ encapsulation sub-region to a $j^{th}$ encapsulation sub-region comprises first holes spaced apart along the extending direction, the dielectric region in each of a $(j+1)^{th}$ encapsulation sub-region to the $N^{th}$ encapsulation sub-region comprises second holes spaced apart along the extending direction, wherein i is a positive integer greater than 1 and smaller than j, and j is a positive integer smaller than N;

wherein no protrusion is disposed in the first holes, and one or more discrete protrusions are disposed in each of the second holes, and wherein a width E1 of the encapsulation region along the first direction, a total width E2 of the $1^{st}$ encapsulation sub-region to the $i^{th}$ encapsulation sub-region along the first direction, and a total width E3 of the $(i+1)^{th}$ encapsulation sub-region to the $j^{th}$ encapsulation sub-region along the first direction satisfy the following relationships: $E2 \leq 1/3 \times E1$, and $E3 \leq 1/3 \times E1$.

6. A display panel, comprising:

a display region and a non-display region, wherein:

the non-display region comprises an encapsulation region, and an encapsulant is disposed in the encapsulation region; and the display panel further comprises:

a substrate an array layer disposed at a side of the substrate;

a dielectric layer disposed on a side of the array layer away from the substrate;

a cover plate disposed opposite to the dielectric layer, wherein the encapsulant is disposed between the dielectric layer and the cover plate;

the dielectric layer in the encapsulation region comprises N encapsulation sub-regions, which are from a $1^{st}$ encapsulation sub-region to a $N^{th}$ encapsulation sub-region and arranged along a first direction according to ascending sequential numbers, an extending direction of each of the encapsulation sub-regions is identical to an extending direction of the encapsulation region; and the $1^{st}$ encapsulation sub-region is among one or more encapsulation sub-regions, each of which has a smallest contact area with the encapsulant among the N encapsulation sub-regions, wherein the dielectric layer in each of the N encapsulation sub-regions comprises holes spaced apart along a second direction, and the second direction is identical to the extending direction of the encapsulation region, wherein an arrangement of the N-encapsulation sub-regions is selected from a group consisting of (a1), (a2), (b1), (b2), (c1) or (c2):

(a1) N is a positive integer greater than or equal to 4;

F discrete protrusions are disposed in each of the holes in each of the $1^{st}$ encapsulation sub-region to an $i^{th}$ encapsulation sub-region;

G discrete protrusions are disposed in each of the holes in each of an $(i+1)^{th}$ encapsulation sub-region to the $N^{th}$ encapsulation sub-region; and i is a positive integer greater than 1 and smaller than N, F is a positive integer greater than 1 and G is a positive integer greater than F;

(a2) N is a positive integer greater than or equal to 4;

F discrete protrusions are disposed in each of the holes in each of the $1^{st}$ encapsulation sub-region to an $i^{th}$ encapsulation sub-region;

G discrete protrusions are disposed in each of the holes in each of an $(i+1)^{th}$ encapsulation sub-region to the $N^{th}$ encapsulation sub-region; and i is a positive integer greater than 1 and smaller than N, F is equal to zero or is a positive integer, and G is a positive integer greater than F+1;

(b1) N is a positive integer greater than or equal to 4;

F discrete protrusions are disposed in each of the holes in each odd-numbered encapsulation sub-region among the N encapsulation sub-regions, the odd-numbered encapsulation sub-regions comprise the 1$^{st}$ encapsulation sub-region;

G discrete protrusions are disposed in each of the holes in each even-numbered encapsulation sub-region among the N encapsulation sub-regions; and F is a positive integer, and G is a positive integer greater than F;

(b2) N is a positive integer greater than or equal to 4;

E discrete protrusions are disposed in each of the holes in each odd-numbered encapsulation sub-region among the N encapsulation sub-regions, the odd-numbered encapsulation sub-regions comprise the 1$^{st}$ encapsulation sub-region;

G discrete protrusions are disposed in each of the holes in each even-numbered encapsulation sub-region among the N encapsulation sub-regions; and F is equal to 0, and G is a positive integer greater than F;

(c1) N is a positive integer greater than or equal to 5;

the N encapsulation sub-regions comprise first-type encapsulation sub-regions, wherein the first-type encapsulation sub-regions comprise the 1$^{st}$ encapsulation region, and second-type encapsulation sub-regions;

F discrete protrusions are disposed in each of the holes in each of the first-type encapsulation sub-regions, and G discrete protrusions are disposed in each of the holes in each of the second-type encapsulation sub-regions, F is a positive integer, and G is a positive integer greater than F; and along the first direction at least one of the second-type encapsulation sub-region(s) is/are disposed between every sequential one of the first-type encapsulation sub-regions;

(c2) N is a positive integer greater than or equal to 5;

the N encapsulation sub-regions comprise first-type encapsulation sub-regions, wherein the first-type encapsulation sub-regions comprise the 1$^{st}$ encapsulation region, and second-type encapsulation sub-regions;

F discrete protrusions are disposed in each of the holes in each of the first-type encapsulation sub-regions, and G discrete protrusions are disposed in each of the holes in each of the second-type encapsulation sub-regions, F is equal to 0, and G is a positive integer greater than F; and along the first direction at least one of the second-type encapsulation sub-region(s) is/are disposed between every sequential one of the first-type encapsulation sub-regions.

7. The display panel according to claim 5, wherein the arrangement is (a1) or (a2), wherein an area of an orthographic projection area of each of the holes in each of the 1$^{st}$ encapsulation sub-region to the i$^{th}$ encapsulation sub-region is smaller than an area of an orthographic projection area of each of the holes in each of the (i+1)$^{th}$ encapsulation sub-region to the N$^{th}$ encapsulation sub-region.

8. The display panel according to claim 6, wherein the arrangement is (a1) or (a2), wherein a density of the holes in each of the 1$^{st}$ encapsulation sub-region to the i$^{th}$ encapsulation sub-region is less than a density of the holes in each of the (i+1)$^{th}$ encapsulation sub-region to the N$^{th}$ encapsulation sub-region.

9. The display panel according to claim 5, wherein the arrangement is (a1) or (a2), a total width H3 of the 1$^{st}$ encapsulation sub-region to the i$^{th}$ encapsulation sub-region along the first direction and a total width H4 of the 1st encapsulation sub-region to the N$^{th}$ encapsulation sub-region along the first direction satisfy the following relationship: $H3 \leq \frac{3}{5} \times H4$.

10. The display panel according to claim 6, wherein the arrangement is (a2), F is equal to 1, and for a discrete protrusion in each of the holes in each of the 1$^{st}$ encapsulation sub-region to the i$^{th}$ encapsulation sub-region:

a width K1 of said hole along the first direction, a spacing K2 between the discrete protrusion in said hole and an edge of said hole along the first direction, and a width K3 of the discrete protrusion in said hole along the first direction satisfy the following relationships: $\frac{1}{9} \times K1 \leq K3 \leq \frac{1}{3} \times K1$, and $K2 = \frac{1}{2} \times (K1 - K3)$.

11. The display panel according to claim 6, wherein the arrangement is (a1) or (a2), G is equal to 4, wherein the four discrete protrusions in each of the holes of the (i+1)$^{th}$ encapsulation sub-region to the N$^{th}$ encapsulation sub-region are provided at equal intervals in a two-dimensional array.

12. The display panel according to claim 11, wherein the arrangement is (a1), F is equal to 3, wherein the three discrete protrusions in each of the holes of the 1$^{st}$ encapsulation sub-region to the i$^{th}$ encapsulation sub-region are provided at identical positions corresponding to the two-dimensional array minus one discrete protrusion.

13. The display panel according to claim 6, wherein the arrangement is (b1), F is equal to 1, and for a discrete protrusion in each of the holes in each of the odd-numbered encapsulation sub-regions:

a width K1 of said hole along the first direction, a spacing K2 between the discrete protrusion in said hole and an edge of said hole along the first direction, and a width K3 of the discrete protrusion in said hole along the first direction satisfy the following relationships: $\frac{1}{9} \times K1 \leq K3 \leq \frac{1}{3} \times K1$, and $K2 = \frac{1}{2} \times (K1 - K3)$.

14. The display panel according to claim 6, wherein the arrangement is (b1) or (b2), G is equal to 4, wherein the four discrete protrusions in each of the holes of the even-numbered encapsulation sub-regions are provided at equal intervals in a two-dimensional array.

15. The display panel according to claim 14, wherein the arrangement is (b1), F is equal to 3, wherein the three discrete protrusions in each of the holes of the odd-numbered encapsulation sub-regions are provided at identical positions corresponding to the two-dimensional array minus one discrete protrusion.

16. The display panel according to claim 6, wherein the arrangement is (c1), F is equal to 1, and for a discrete protrusion in each of the holes in each of the second-type encapsulation sub-regions:

a width K1 of said hole along the first direction, a spacing K2 between the discrete protrusion in said hole and an edge of said hole along the first direction, and a width K3 of the discrete protrusion in said hole along the first direction satisfy the following relationships: $\frac{1}{9} \times K1 \leq K3 \leq \frac{1}{3} \times K1$, and $K2 = \frac{1}{2} \times (K1 - K3)$.

17. The display panel according to claim 6, wherein the arrangement is (c1) or (c2), G is equal to 4, wherein the four discrete protrusions in each of the holes of the second-type encapsulation sub-regions are provided at equal intervals in a two-dimensional array.

18. The display panel according to claim 17, wherein the arrangement is (c1), F is equal to 3, wherein the three discrete protrusions in each of the holes of the first-type encapsulation sub-regions are provided at identical positions corresponding to the two-dimensional array minus one discrete protrusion.

19. The display panel according to claim 6, N is a positive integer greater than or equal to 6, wherein the arrangement is (c1) or (c2), wherein along the first direction two of the second-type encapsulation sub-regions are disposed between every sequential one of the first-type encapsulation sub-regions.

20. A display device, comprising the display panel according to claim 6.

* * * * *